United States Patent [19]

Miyatake

[11] Patent Number: 4,890,011
[45] Date of Patent: Dec. 26, 1989

[54] ON-CHIP SUBSTRATE BIAS GENERATING CIRCUIT HAVING SUBSTRATE POTENTIAL CLAMP AND OPERATING METHOD THEREFOR

[75] Inventor: Hideshi Miyatake, Hyogo, Japan

[73] Assignee: Mitsubishi Denki Kabushiki Kaisha, Tokyo, Japan

[21] Appl. No.: 192,576

[22] Filed: May 11, 1988

[30] Foreign Application Priority Data

May 12, 1987 [JP] Japan .................... 62-115291

[51] Int. Cl.[4] .................... H03K 3/354; H01L 19/00; H01L 27/04
[52] U.S. Cl. .................... 307/296.2; 307/304
[58] Field of Search ............... 307/296 R, 297, 296 A, 307/296.2, 296.8, 304, 200 B; 363/59-62

[56] References Cited

U.S. PATENT DOCUMENTS

| | | | |
|---|---|---|---|
| 3,940,747 | 2/1976 | Kuo et al. | 340/173 D R |
| 4,450,515 | 5/1984 | Takemae et al. | 307/296.2 |
| 4,553,047 | 11/1985 | Dillinger et al. | 307/296.2 |
| 4,695,746 | 9/1987 | Tobita | 307/296.2 |
| 4,705,966 | 11/1987 | Van Zanten | 307/296.2 |
| 4,733,108 | 3/1988 | Truong | 307/296.2 |
| 4,739,191 | 4/1988 | Puar | 307/296.2 |
| 4,794,278 | 12/1988 | Vajdic | 307/296.2 |

OTHER PUBLICATIONS

ISSCC 76: "A 70ns 1K MOS RAM" by R. D. Pashley et al., Session XII: Memory I, Feb. 19, 1976, pp. 138-139.

IEEE Trans. on Electron Dev.: "Single 5-V, 64K RAM with Scaled-Down MOS Structure", by H. Masuda et al., vol. ED-27, No. 8, Aug. 1980, pp. 1607-1612.

IEDM 85: "Static Transient Latch-Up Hardness in N-Well CMOS With On-Chip Substrate Bias Generator", by D. Takacs et al., 18.5, 1985, pp. 504-508.

*Primary Examiner*—Stanley D. Miller
*Assistant Examiner*—David R. Bertelson
*Attorney, Agent, or Firm*—Lowe, Price, LeBlanc, Becker & Shur

[57] ABSTRACT

A semiconductor integrated circuit having a power supply terminal, ground terminal and a substrate bias terminal comprises a substrate voltage generating circuit connected to the power supply terminal and the ground terminal for generating a substrate bias voltage of a predetermined value and for applying the same to the substrate bias terminal, a MOS transistor provided between the substrate bias terminal and the ground terminal for bringing the substrate potential to the ground potential when the supply voltage of the power supply terminal exceeds a prescribed voltage value and a plurality of diode connected MOS transistors connected between the power supply terminal and the gate of the MOS transistor for deciding the prescribed voltage value.

18 Claims, 6 Drawing Sheets

FIG. 8A
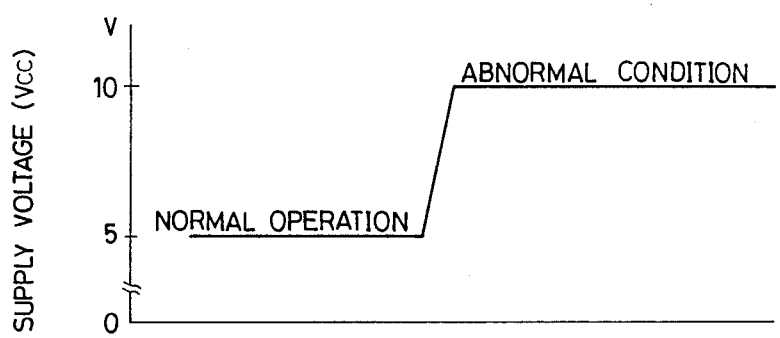
FIG. 8B
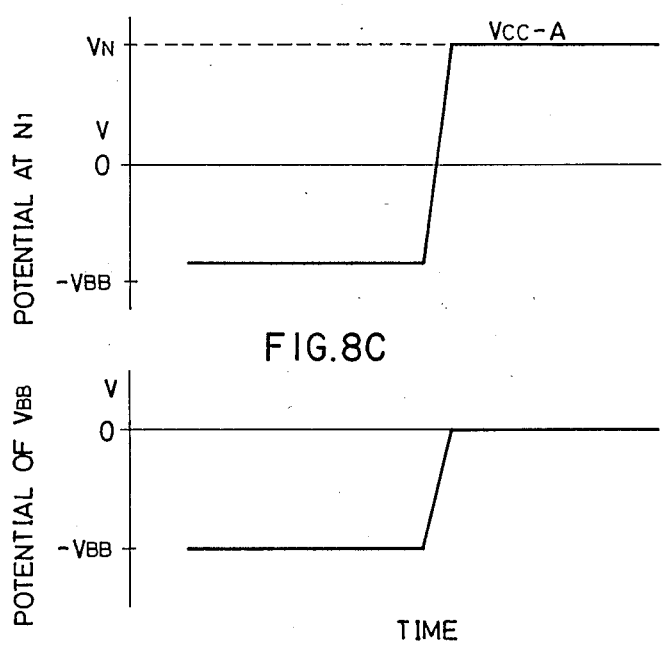
FIG. 8C
FIG. 8D
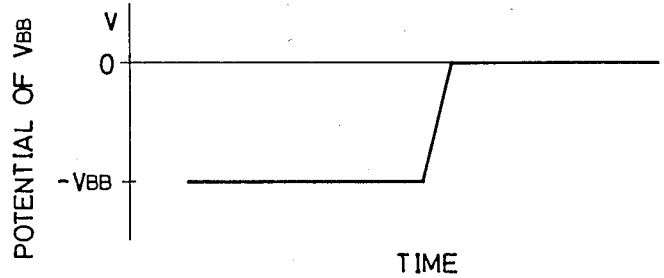

4,890,011

ON-CHIP SUBSTRATE BIAS GENERATING CIRCUIT HAVING SUBSTRATE POTENTIAL CLAMP AND OPERATING METHOD THEREFOR

BACKGROUND OF THE INVENTION

1. Field of the Invention

The invention relates generally to biasing the substrate of a semiconductor integrated circuit containing field effect devices, and more particularly, to a method of and apparatus for controlling substrate bias potential to prevent parasitic transistor latch up tending to occur in response to excessive power supply voltage.

2. Description of the Prior Art

A dynamic type semiconductor memory device has been well known. It is used as a main memory of a computer. FIG. 1 is a block diagram showing a whole structure of such conventional dynamic type semiconductor memory device.

Referring to FIG. 1, the dynamic type semiconductor memory device (hereinafter referred to as dynamic RAM) comprises a memory cell array including a plurality of memory cells serving as a memory portion, a row decoder and a column decoder for selecting the address thereof and an input/output interface portion including a sense amplifier connected to an input/output buffer. The plurality of memory cells are connected to each of the intersections of the word lines connected to the row decoder and the bit lines connected to the column decoder and these word lines and bit lines forming a matrix. Thus the said array is constituted.

Next the operation will be described. Upon receipt of the externally applied row address signal and column address signal, a memory cell is selected which is at the intersection of one word line and one bit line selected by the row decoder and the column decoder and the information is read from or written into the memory cell through the input/output interface portion including the sense amplifier and through the input/output buffer.

As to the further details of the operation of the Dynamic RAM, U.S. Pat. No. 3,940,747 entitled "High Density, High Speed Random Access Read-Write Memory" can be referred to.

Recently, the peripheral circuits at the dynamic RAM are formed of CMOS. The peripheral circuits comprise a clock generator circuit, a row and column address buffer, data in buffers and data out buffers shown in FIG. 1. The reason for this is that it decreases the power consumption of the dynamic RAM and it increases the speed of operation of the dynamic RAM. Meanwhile, a substrate voltage is applied to the substrate of the dynamic RAM, mainly for the following reasons. The first reason is that it decreases the bit line capacitance. The reason will be described in the following with reference to FIG. 2. FIG. 2 is a partial sectional view of a memory cell in a dynamic RAM. The memory cell comprises one transistor and one capacitor. The transistor comprises a source 51, a drain 52 and a gate electrode 53 which serves as a word line. The capacitor comprises a storage gate 54, an N+ diffusion layer 52 and an insulating film 55 interposed therebetween. A bit line 56 is connected to the N+ diffusion layer 51. Since the N+ diffusion layer 51 is formed on the main surface of the P type substrate, a PN junction is formed at the bit line connecting portion. Consequently, a junction capacitance is generated here. The junction capacitance varies dependent on a voltage applied to the PN junction portion. Therefore, the junction capacitance can be varied by applying a bias voltage to the substrate. The capacitance at the bit line connecting portion can be minimized, enabling fast operation of the dynamic RAM.

Meanwhile, the read out voltage from the memory cell $V_R$ can be represented by the following equation.

$$V_R \alpha \frac{1}{C_B/C_S + 1} \cdot V_{CC}$$

where
$C_B$: bit line capacitance
$C_S$: storage capacitance
$V_{CC}$: supply voltage For the above described reasons, when a substrate bias voltage is applied, the capacitance $C_B$ is decreased. Therefore, the ratio of $C_B/C_S$ can be improved, increasing the signal voltage of the read out voltage from the cell.

The second reason is that it adjusts the threshold voltage of the transfer gate of the memory cell. The reason will be described in the following with reference to FIG. 3. FIG. 3 shows the relation between the substrate bias voltage and the threshold voltage of the MOS transistor. As shown in the figure, the threshold voltage of the MOS transistor depends on the substrate voltage. When the substrate voltage is small (the portion A in the figure) the threshold voltage fluctuates widely, and when it is large (the portion B in the figure), the fluctuation of the threshold voltage varies small even if the amount of fluctuation of the substrate voltage is the same ($V_A > V_B$). It is not preferable to the operation of the dynamic RAM that the threshold voltage varies widely due to a slight fluctuation of the substrate potential. Therefore, it is necessary that the MOS transistor is operated in the region where the fluctuation $V_{BB}$ have little influence on the fluctuation of $V_{TH}$.

The third reason is that it prevents minority carriers from being injected when the signal is externally inputted. When electrons are injected in the substrate, the electrons are trapped in a capacitor (the reference numeral 52 of FIG. 2) when no substrate bias voltage is supplied to the substrate. Consequently, the stored information in the memory cell are destroyed. If a substrate bias voltage of about −3 V is applied to the substrate, the electrons injected into the substrate can be trapped at the supply potential.

FIG. 4 is a cross sectional view of a CMOS inverter which is often employed in a peripheral circuit of the dynamic RAM. The CMOS inverter comprises an N channel transistor formed on a main surface of a P type substrate 32 and a P channel transistor formed on a main surface of an N well 28. The N channel transistor comprises two N+ diffusion layers 23 and 24, and a gate electrode 27 formed above and insulated from the channel region, the end of which is defined by the N+ diffusion layers 23 and 24. The P channel transistor, formed on the main surface of the N well 28, comprises two P+ diffusion layers 21 and 22 and a gate electrode 26 formed above and insulated from the channel region, the end of which is defined by the P+ diffusion layers 21 and 22. The N channel transistor and the P channel transistor are separated from each other on the main surface of the substrate 32 by an oxide film 29. A supply voltage $V_{CC}$ is connected to the N+ diffusion layer 25 and to the P+ diffusion layer 21 formed on the main surface of the N well 28. One of the N+ diffusion layers 24 constituting the N channel transistor is grounded.

The gate electrodes 26 and 27 are connected to an input line of the inverter, and the P+ diffusion layer 22 and the N+ diffusion layer 23 are connected to an output line of the inverter. A vertical PNP transistor 30 and a lateral NPN transistor are parasitic upon the inverter. The reason for this is that the N well 28 is formed on the P type substrate 32. A substrate voltage $V_{BB}$ is applied to the substrate 32.

FIG. 5 shows a conventionally used substrate voltage $V_{BB}$ generation circuit. This is shown in "Static and Transient Latch up Hardness in N-Well MOS with on-chip Substrate Bias Generator" D. Takacs, et al., IEDM 85, 1985. Referring to FIG. 3, the substrate voltage generation circuit comprises an oscillator 4 to which the supply voltage $V_{CC}$ is applied, a capacitor 3 having one electrode connected to the oscillator 4, a first MOS transistor 1 having its gate electrode and source connected to the other electrode of the capacitor 3, and a second MOS transistor having its drain connected to the source of the first MOS transistor 1 at a node 5 and its gate electrode and source connected to the substrate.

The operation of the conventional substrate voltage generation circuit will be described. When the oscillator 4 oscillates at 5 MHz and the voltage of $V_{CC}$, the potential of the node 5 becomes the threshold voltage $V_{TH}$ of the MOS transistor. The reason for this is that when $V_{CC}$ exceeds the threshold voltage $V_{TH}$ of the first MOS transistor 1, the node 5 is grounded by the switching function of the first MOS transistor 1. On this occasion, the second MOS transistor 2 is in the cut off state. When the voltage of the oscillator changes from $V_{CC}$ to 0, the potential of the node 5 tends to become $V_{TH} - V_{CC}$. However, on this occasion, the second MOS transistor 2 turns on and electrons flow into the node 5 from $V_{BB}$. Consequently, the potential of $V_{BB}$ slightly lowers. By the repetition of the above described operation, the potential of $V_{BB}$ gradually becomes negative potential. The above described operation is the well known charge pump function and the detail thereof is shown in, e.g., "A 70-ns 1k MOS RAM" R. D. Pashley and G. A. McCormick, ISSC Digest of Technical Papers, pp. 138-139, Feb., 1976.

FIG. 6 shows the dependency of the supply voltage ($V_{CC}$) of the substrate voltage generation circuit of FIG. 3. The solid line a shows the standby state while the dotted line b shows the operating state. When the supply voltage $V_{CC}$ becomes high, the high level of the output of the oscillator 4 also becomes high. As a result, the substrate voltage $V_{BB}$ becomes deep in the negative potential direction. As is shown in "Single 5-V, 65k RAM with Scaled-Down MOS Structure" Hiroo Masuda et al., IEEE Transactions on Electron Devices, Vol. ED-27, No. 8, pp. 1607-1612, Aug., 1980. The substrate potential becomes shallow in the operating state. The reason is that the substrate current flows and the charge pump can not cope with this current. Consequently, sometimes the substrate potential becomes positive potential due to the high resistance of the substrate. Meanwhile, since the substrate current does not flow in the standby state, the substrate potential remains in the deep state up to a high supply voltage $V_{CC}$. In the standby state, however, sometimes the substrate becomes a positive potential due to a junction breakdown of the N+ diffusion layer and the substrate of the supply potential.

When the substrate becomes the positive potential as described above, a latch up phenomenon occurs. The latch up phenomenon in the CMOS structure is well known. The latch up occurs with the bipolar transistors 30 and 31 of FIG. 2 being turned on. The major causes of the latch up are as follows.

(1) Causes in the normal operation
  ① Instant power failure
  ② Failure of the power supply of the dynamic RAM
  ③ Generation of surge voltage
(2) Accelerated test A supply voltage exceeding a specified value is applied to the DRAM on purpose to screen defective DRAMs. When the latch up occurs, a current of some 10 to some 100 mA flows between the supply voltage $V_{CC}$ and the ground, the wiring materials melt causing the destruction of the device.

SUMMARY OF THE INVENTION

One object of the invention is to provide a method of and circuitry for preventing latching up of parasitic transistors in a semiconductor integrated circuit containing field effect devices.

Another object of the invention is to provide a method of and circuit for preventing, in a semiconductor integrated circuit containing field effect devices, latching up of parasitic transistors that tends to occur upon application of excessive power supply voltage to the integrated circuit.

Another object is to provide a method of and circuit for preventing, in a dynamic random access memory integrated circuit containing field effect devices, latching up of parasitic transistors that tends to occur upon application of excessive power supply voltage to the integrated circuit.

A further object of the invention is to prevent latching up of semiconductor integrated circuits containing field effect devices upon application thereto of transient voltages that tends to temporarily increase the magnitude of the power supply voltage.

Briefly stated, an apparatus for controlling substrate bias potential in accordance with the present invention for a semiconductor device including a semiconductor substrate on which field effect transistors are formed, the device including a power supply terminal, a ground terminal and a substrate bias terminal, parasitic capacitance tending to be formed between the power supply terminal and the substrate bias terminal, the device further including a substrate bias generating circuit coupled to the power supply terminal and the ground terminal for generating a substrate bias voltage having a predetermined value and applying the substrate bias voltage to said substrate bias terminal, comprises a substrate potential claiming circuit, comprising: (a) reference means for establishing a reference potential; (b) measurement means connected to the power supply terminal for measuring the magnitude of an external voltage applied thereto; and (c) control means responsive to the measurement means for bringing the substrate voltage of the substrate potential terminal to the ground potential when the external voltage magnitude exceeds the reference potential.

Since an apparatus for controlling substrate bias potential in accordance with the present invention comprises above described substrate potential clamping circuit, the substrate potential does not become the positive potential and, therefore, latch up phenomenon does not occur.

In a preferred embodiment of the present invention, for a semiconductor device including a semiconductor substrate on which field effect transistors are formed, the device including a power supply terminal, a ground terminal and a substrate bias terminal, parasitic capacitance tending to be formed between the power supply terminal and the substrate bias terminal, the device further including a substrate bias generating circuit coupled to said power supply terminal and said ground terminal for generating a substrate bias voltage having a predetermined value and applying said substrate bias voltage to said substrate bias terminal, a method of controlling the substrate bias voltage to prevent latching up of the device upon application of an excessive external voltage to the power supply terminal, comprising the steps of: (a) establishing a reference potential; (b) measuring the magnitude of said external voltage applied to said power supply terminal; and (c) bringing the substrate voltage at said substrate potential terminal to said ground potential when the external voltage magnitude exceeds the reference potential.

Since the method of controlling the substrate bias in accordance with the present invention comprises the above described steps, a method of preventing latching up of parasitic transistors in a semiconductor integrated circuit containing field effect devices can be provided.

In a more preferred embodiment, an apparatus for controlling substrate bias potential comprises a substrate bias generation circuit having a supply terminal, ground terminal and a substrate bias terminal, being connected between the power supply terminal and the ground terminal for generating a substrate potential having a predetermined value and for applying the same to the substrate bias terminal, and a substrate potential clamping circuit including a plurality of first MOS transistors connected in series between the power supply terminal and a node, a second MOS transistor provided between the node and the ground terminal and operating in response to the supply voltage, a third MOS transistor provided between the substrate bias terminal and a node and operating in response to the potential of the ground terminal and a fourth MOS transistor connected between the substrate bias terminal and a ground terminal and operating in response to the potential of the node.

By structuring the apparatus for controlling substrate potential as described above, the operation voltage of the substrate potential clamping circuit can be freely set by changing the number of the first MOS transistors.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 8 shows the relation between the potentials at major points and a state of each transistor incorporated;

DESCRIPTION OF THE PREFERRED EMBODIMENTS

Figure 1:
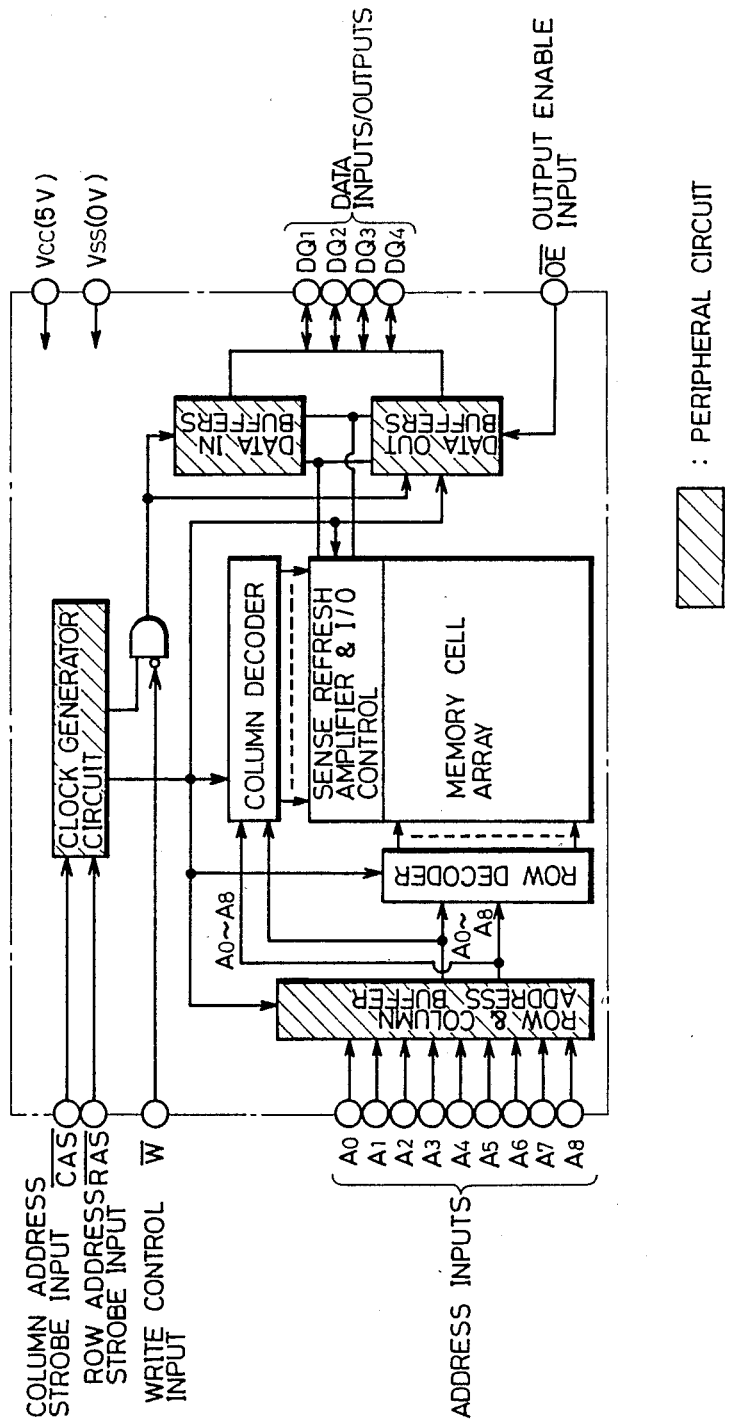
FIG. 1 is a block diagram showing the whole structure of a dynamic type semiconductor memory device.
Figure 2:
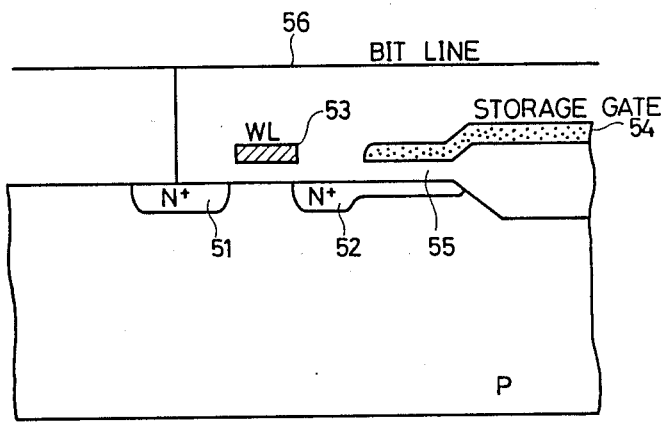
FIG. 2 is a cross sectional view of a memory cell of the dynamic type semiconductor memory device.
Figure 3:
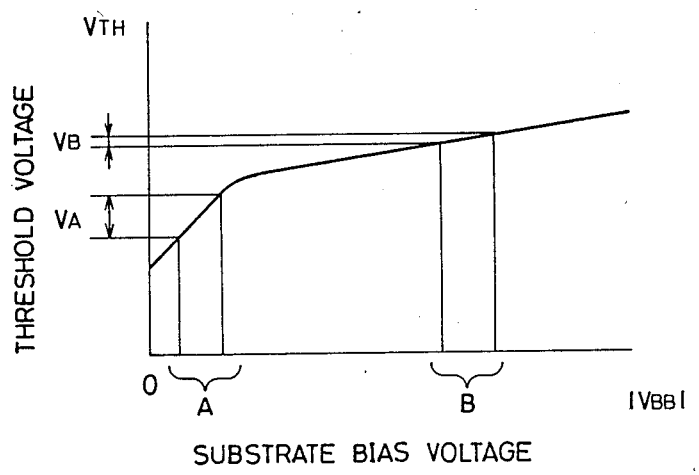
FIG. 3 shows a relation between the substrate bias voltage and the threshold voltage of MOS transistor.
Figure 4:
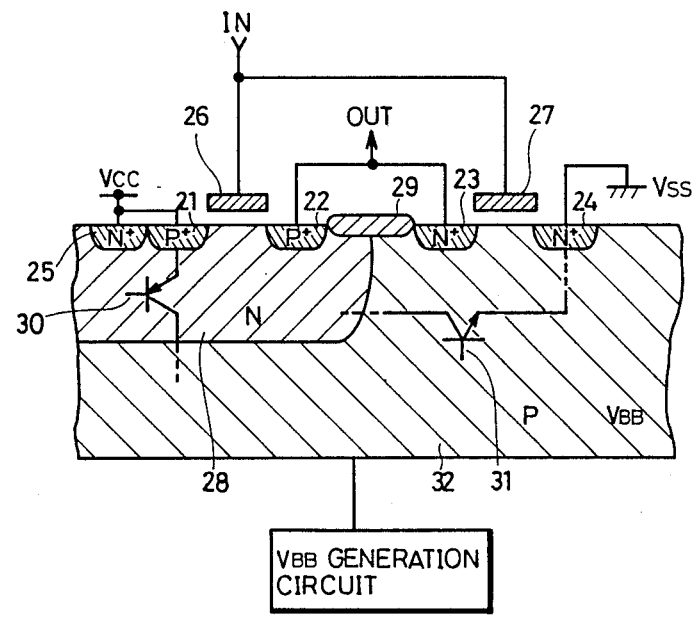
FIG. 4 is a cross sectional view of a CMOS inverter employed in the peripheral circuit of the dynamic type semiconductor memory device.
Figure 5:
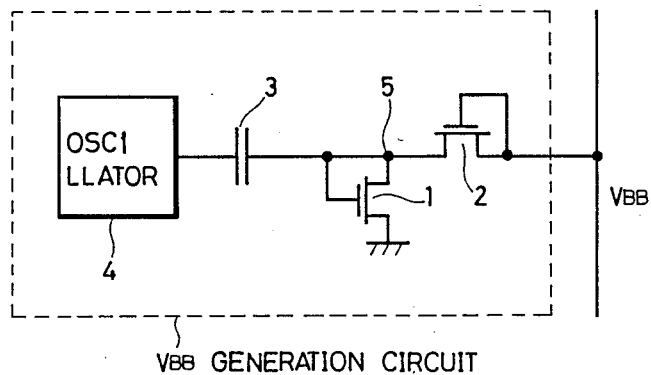
FIG. 5 shows a conventional substrate voltage generation circuit.
Figure 7:
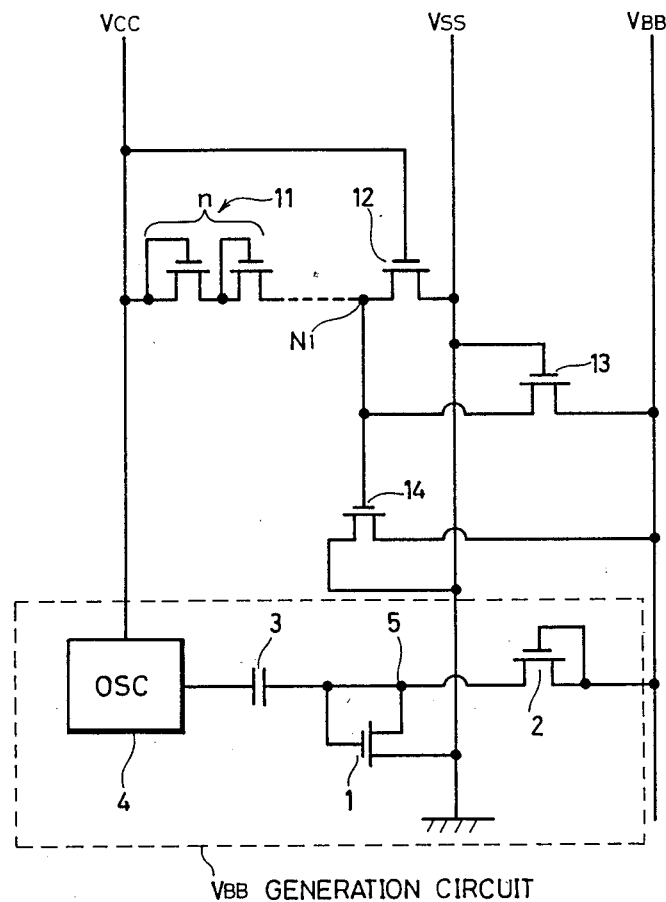
FIG. 7 shows the substrate voltage generation circuit in which the substrate voltage clamping circuit of the present invention is incorporated.
Figure 6:
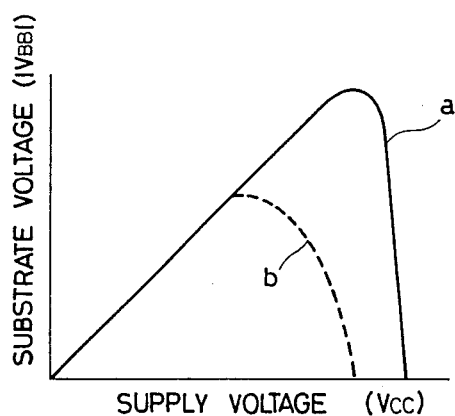
FIG. 6 shows the relation between the substrate voltage and a supply voltage when the circuit of FIG. 3 is applied to a dynamic RAM.
Figure 9:
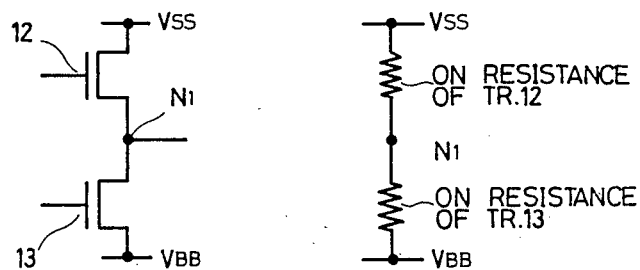
FIG. 9 illustrates the potential at the node N1.

One embodiment of the present invention will be hereinafter described with reference to the figures. FIG. 7 shows the substrate voltage clamping circuit incorporated in the substrate voltage generation circuit of the dynamic type semiconductor memory device in accordance with the present invention.

Referring to FIG. 7, the substrate voltage clamping circuit comprises a plurality of N channel MOS transistors connected in series such that the gate and source connected to the supply conductor $V_{CC}$, the drain connected to the gate and source of the succeeding transistor and the drain of the last transistor is connected to the node N1, an N channel MOS transistor 12 having its gate connected to the supply conductor $V_{CC}$, its source connected to the node N1 and its drain connected to the ground $V_{SS}$, an N channel MOS transistor 13 having its gate connected to the ground $V_{SS}$, its source connected to the substrate conductor $V_{BB}$ and its drain connected to the node N1 and an N channel MOS transistor 14 having its gate connected to the node N1, its source connected to the substrate conductor $V_{BB}$ and its drain connected to the ground $V_{SS}$. The on resistance of the substrate voltage generating circuit (the current provided by the charge pump circuit) is relatively larger than that of the transistor 14. The on resistance of the transistor 12 is relatively larger than that of the transistor 13. The on resistance of the transistor 12 is relatively larger than that of the substrate voltage generating circuit. In addition, the on resistance of the transistor 14 when it is on is relatively larger than that of the on resistance of the diode connected transistor 11 formed of a plurality of transistors.

The operation of the circuit of FIG. 7 will be described.

When the supply voltage $V_{CC}$ is at low level, all of the n transistors are not on and only the transistor 12 is on. As a result, the potential of the node N1 is drawn to the ground. On this occasion, since the substrate potential $V_{BB}$ is negative potential, the transistor 13 is turned on. However, since the on resistance of the transistor 12 is sufficiently larger than that of the transistor 13, the potential of the node N1 becomes the negative potential almost the same as the substrate potential $V_{BB}$. Therefore, the transistor 14 doesn't turn on and a normal substrate voltage is applied to the substrate. On this occasion, although a through current flows through the transistors 12 and 13, the substrate voltage is not influenced because the on resistance of the transistor 12 is large.

Meanwhile, when the supply voltage $V_{CC}$ is at high level, all of the n transistors 11 are on. Since the on resistance of transistor 12 is larger than that of the n transistors 11, the potential of the node N1 becomes high level. Therefore, the transistor 14 turns on and the substrate potential $V_{BB}$ is forced to be the ground $V_{SS}$.

The high potential of the node N1 is not transferred to the substrate potential $V_{BB}$, since the transistor 13 is off.

Based on the above described operation, a process will be described in which the substrate potential is clamped to 0 V when the substrate potential exceeds a prescribed value.

FIG. 8 shows the potential at major points of the substrate bias circuit and the on/off state of each of the transistors at that time. Referring to FIG. 8, in the normal operation, the supply voltage is maintained at about 5 V. On this occasion, only the transistors 12 and 13 are on and the transistors 11 and 14 are off. In the normal operation, the potential of the N1 is determined by the ratio of the on resistance of the transistors 12 and 13. Since the on resistance of the transistor $12 >>$ the on resistance of the transistor 13, the potential at the node N1 is maintained at about $-V_{BB}$. The reason why it is not exactly $-V_{BB}$ is that a little current flows through the transistor 12. On this occasion, the substrate potential is kept at $-V_{BB}$. If an accident such as an instant power failure, generation of surge voltage and so on happens, the supply voltage $V_{CC}$ increases. At that time, all of the n transistors are turned on. consequently, the potential at the node N1 becomes $V_{CC}$ -A, where $A = n.V_{TH}$ (n is the number of the transistors 11). Consequently, the transistor 14 turns on and the substrate potential $V_{BB}$ is clamped at 0 V.

As described above, when the supply voltage $V_{CC}$ exceeds a certain value, the substrate potential $V_{BB}$ can be brought to the ground voltage $V_{SS}$. This certain value of the supply voltage $V_{CC}$ can be adjusted by the threshold value and the number of the transistors 11.

Figure 10:
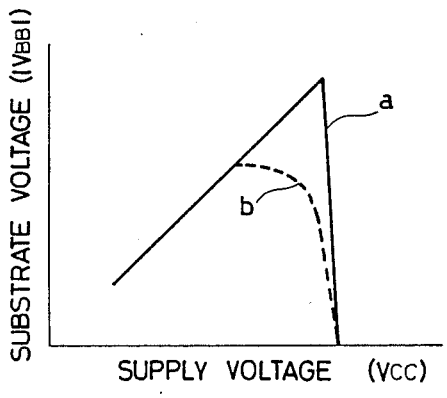
FIG. 10 shows the relation between the substrate voltage and a supply voltage when the substrate voltage clamping circuit of the present invention is employed.

FIG. 10 shows the characteristic of the substrate voltage when the circuit of FIG. 7 is applied to the dynamic RAM. The solid line a shows the standby state of the RAM while the dotted line b shows the operating state of the RAM. As is seen from the figure, in the RAM employing the circuit of FIG. 7, the substrate voltage $V_{BB}$ becomes GND when the supply voltage $V_{CC}$ exceeds a certain value. As described above, the certain value of the supply voltage $V_{CC}$ is adjustable. If this value is adjusted to be the value near the breakdown voltage of the junction in the substrate, the substrate voltage does not become positive even when the voltage value becomes high. Consequently, the value of the supply voltage $V_{CC}$ which causes the latch up phenomenon can be greatly raised.

Although an N-well CMOS structure is described in the above described embodiment, a P-well CMOS structure may be also used. It goes without saying that the same effect described in the above embodiment can also be obtained in this case.

As described above, according to the present invention, an apparatus for controlling substrate bias potential for a semiconductor device including the semiconductor substrate on which field effect transistors are formed, the device including a power supply terminal, a ground terminal and a substrate bias terminal, parasitic capacitance tending to be formed between the power supply terminal and the substrate bias terminal, the device further including a substrate bias generating circuit coupled to the power supply terminal and the ground terminal for generating a substrate bias voltage having a predetermined value and applying the substrate bias voltage to said substrate bias terminal, comprises a substrate potential clamping circuit, comprising: (a) reference means for establishing a reference potential; (b) measurement means connected to the power supply terminal for measuring the magnitude of an external voltage applied thereto; and (c) control means responsive to the measurement means for bringing the substrate voltage of the substrate potential terminal to the ground potential when the external voltage magnitude exceeds the reference potential. The substrate voltage is clamped at the ground potential when the power supply voltage exceeds a prescribed high voltage value. As a result, a semiconductor integrated circuit containing field effect devices capable of preventing latching up of parasitic transistors is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. For a semiconductor device including a semiconductor substrate on which field effect transistors are formed, said device including a power supply node, a ground node and a substrate bias node, parasitic capacitance being formed between said power supply node and said substrate bias node, said device further including a substrate bias generating circuit coupled to said power supply node and said ground node for generating a substrate bias voltage having a predetermined value and applying said substrate bias voltage to said substrate bias node, a substrate potential clamping circuit, comprising:

(a) reference means for establishing a reference potential;
   (b) measurement means connected to said power supply node for measuring the magnitude of an external voltage applied thereto; and
   (c) control means responsive to said measurement means and said reference means for clamping the substrate voltage of said substrate potential node to said ground potential while the external voltage magnitude exceeds said reference potential.

2. A substrate potential clamping circuit according to claim 1, wherein said reference means comprises a plurality of diode connected first switching devices.

3. A substrate potential clamping circuit according to claim 2, wherein said first switching devices comprise first field effect transistors and said reference potential is denoted by a sum of threshold voltages of said plurality of field effect transistors.

4. A substrate potential clamping circuit according to claim 3, wherein said reference potential comprises a value near the junction breakdown voltage of said semiconductor device.

5. A substrate potential clamping circuit according to claim 2, wherein said measurement means comprises said plurality of diode connected first switching devices.

6. A substrate potential clamping circuit according to claim 5, wherein said measurement means includes means for comparing the sum of the threshold voltages of said first field effect transistors with said external voltage.

7. A substrate potential clamping circuit according to claim 2, wherein said control means comprises a second switching device provided between said substrate bias node and said ground node and operates in response to an output of said first switching device.

8. A substrate potential clamping circuit according to claim 7, wherein said second switching device comprises a second field effect transistor.

9. For a semiconductor device including a semiconductor substrate on which field effect transistors are formed, said device including a power supply node, a ground node and a substrate bias node, parasitic capacitance being formed between said power supply node and said substrate bias node, said device further including a substrate bias generating circuit coupled to said power supply node and said ground node for generating a substrate bias voltage having a predetermined value and applying said substrate bias voltage to said substrate bias node, a substrate potential clamping circuit, comprising:
(a) reference means for establishing a reference potential;
(b) measurement means connected to said power supply node for measuring the magnitude of an external voltage applied thereto; and
(c) control means responsive to said measurement means and said reference means for clamping the substrate voltage of said substrate potential node to said ground potential while the external voltage magnitude exceeds said reference potential;
wherein said reference means comprises a plurality of diode connected first switching devices comprising first field effect transistors;
wherein said measurement means includes means for comparing the sum of the threshold voltages of said first field effect transistors with said external voltage; and
wherein said control means further comprises a second field effect transistor provided between said substrate bias node and said ground node and operates in response to an output of said first field effect transistors.

10. A substrate potential clamping circuit according to claim 9, wherein said control means further comprises
a third field effect transistor provided between said substrate bias node and the output of said first field effect transistor which operates in response to the potential of said ground node; and
a fourth field effect transistor provided between the output of said first field effect transistor and said ground node which operates in response to the output of said supply node.

11. A substrate potential clamping circuit according to claim 10, wherein the on resistance of said third field effect transistor is selected to be smaller than that of said fourth field effect transistor.

12. For a semiconductor device including a semiconductor substrate on which field effect transistors are formed, said device including a power supply node, a ground node and a substrate bias node, parasitic capacitance being formed between said power supply node and said substrate bias node, said device further including a substrate bias generating circuit coupled to said power supply node and said ground node for generating a substrate bias voltage having a predetermined value and applying said substrate bias voltage to said substrate bias node, a method of preventing latching up of said device upon application of an excessive external voltage to said power supply node, comprising the steps of:
(a) establishing a reference potential;
(b) measuring the magnitude of said external voltage applied to said power supply node; and
(c) clamping the substrate voltage at said substrate potential node to said ground potential while the external voltage magnitude exceeds said reference potential.

13. A method according to claim 12, wherein said step of establishing said reference potential comprises the step of using a sum of threshold voltages across a plurality of diode connected first field effect transistors to provide said reference potential.

14. A method according to claim 13, wherein said reference potential comprises a value near a junction breakdown voltage of said semiconductor device.

15. A method according to claim 13, wherein said step of measuring the magnitude of said external voltage comprises the step of comparing said sum of threshold voltages across the first field effect transistors with said external voltage.

16. A method according to claim 15, wherein said step of clamping said substrate voltage at the substrate potential node to said ground potential comprises the step of connecting a second field effect transistor between said substrate bias node and said ground node and operating said second field effect transistor in response to an output of said first field effect transistor.

17. A method according to claim 16, wherein said step of bringing said substrate voltage at the substrate potential node to said ground potential further comprises the steps of connecting a third field effect transistor between said substrate bias node and an output of said first field effect transistors and operating the third field effect transistor in response to the potential of said ground node; connecting a fourth field effect transistor between said output of said first field effect transistors and said ground node and operating said fourth field effect transistor in response to the output of said supply node.

18. A method according to claim 17, including selecting resistance of said third field effect transistors to be smaller than that of said fourth field effect transistor.

* * * * *